(12) United States Patent
Kubota (10) Patent No.: US 9,729,161 B2
(45) Date of Patent: Aug. 8, 2017

(54) ANALOG CONVERTER AND PROGRAMMABLE LOGIC CONTROLLER SYSTEM

(75) Inventor: Yoshiyuki Kubota, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 149 days.

(21) Appl. No.: 14/390,898

(22) PCT Filed: May 11, 2012

(86) PCT No.: PCT/JP2012/062161
§ 371 (c)(1),
(2), (4) Date: Oct. 6, 2014

(87) PCT Pub. No.: WO2013/168284
PCT Pub. Date: Nov. 14, 2013

(65) Prior Publication Data
US 2015/0066159 A1 Mar. 5, 2015

(51) Int. Cl.
*H03M 1/06* (2006.01)
*H03M 1/10* (2006.01)
(Continued)

(52) U.S. Cl.
CPC ........ *H03M 1/0617* (2013.01); *G05B 19/05* (2013.01); *H03M 1/1028* (2013.01); *G05B 2219/1176* (2013.01); *H03M 1/12* (2013.01)

(58) Field of Classification Search
None
See application file for complete search history.

(56) References Cited

U.S. PATENT DOCUMENTS

| 7,050,859 B1* | 5/2006 | Govindaraj | G05B 19/058 700/1 |
| 8,543,744 B2 | 9/2013 | Onishi et al. | |
| 2011/0307635 A1 | 12/2011 | Onishi et al. | |

FOREIGN PATENT DOCUMENTS

| JP | 06-062642 U | 9/1994 |
| JP | 07-078007 A | 3/1995 |

(Continued)

OTHER PUBLICATIONS

Taiwanese Office Action, issued May 11, 2012, Application No. 101138194.
(Continued)

*Primary Examiner* — Mohammad Ali
*Assistant Examiner* — Saad M Kabir
(74) *Attorney, Agent, or Firm* — Sughrue Mion, PLLC; Richard C. Turner (57) ABSTRACT

An analog converter includes an offset/gain value storage unit that is composed of a nonvolatile memory and stores therein offset/gain values, an operation unit that performs analog-digital conversion by using the offset/gain values in the offset/gain value storage unit as values for an interpolation operation, a previous offset/gain value storage unit that is composed of a nonvolatile memory and stores therein, as previous offset/gain values, the offset/gain values in the offset/gain value storage unit used in the past, wherein the operation unit includes an offset/gain value setting unit that controls setting of the offset/gain values in the offset/gain value storage unit and storage of the previous offset/gain values in the previous offset/gain value storage unit.

5 Claims, 6 Drawing Sheets

(51) Int. Cl.
*G05B 19/05* (2006.01)
*H03M 1/12* (2006.01)

(56) References Cited

FOREIGN PATENT DOCUMENTS

| | | |
|---|---|---|
| JP | 2001-203579 A | 7/2001 |
| JP | 2001-217713 A | 8/2001 |
| JP | 2005-244294 A | 9/2005 |
| JP | 2005-244771 A | 9/2005 |
| TW | 201036340 A | 10/2010 |

OTHER PUBLICATIONS

International Search Report for PCT/JP2012/062161 dated Jun. 12, 2012 [PCT/ISA/210).
Written Opinion for PCT/JP2012/062161 dated Jun. 12, 2012 (PCT/ISA/237).

* cited by examiner

ANALOG CONVERTER AND PROGRAMMABLE LOGIC CONTROLLER SYSTEM

CROSS REFERENCE TO RELATED APPLICATION

This application is a National Stage of International Application No. PCT/JP2012/062161 filed May 11, 2012, the contents of all of which are incorporated herein by reference in their entirety.

FIELD

The present invention relates to an analog converter and a programmable logic controller system.

BACKGROUND

When an analog data value is input in a programmable logic controller (hereinafter, PLC), an analog input unit (an A/D converter) that converts an analog data value to a digital value is used, and when an analog data value is output from the PLC, an analog output unit (a D/A converter) that converts a digital value to an analog data value to be output is used.

Generally, when an analog data value is converted to a digital value or when a digital value is converted to an analog data value, offset/gain values are used. An offset value is a value corresponding to a minimum value of an analog data value to be converted, and a gain value is a value corresponding to a maximum value of an analog data value to be converted. In the A/D converter and the D/A converter (hereinafter, collectively "analog converter(s)"), analog conversion is realized by performing linear interpolation using a binary of an offset value and a gain value.

In an analog converter mounted on a PLC, offset/gain values thereof are written in a nonvolatile memory in a unit of the analog converter when it is manufactured. As these offset/gain values, calibrated values, such as 0 volt (V), 10 V, 0 milliampere (mA), 4 mA, and 20 mA, for correctly handling analog data are written in the nonvolatile memory. These offset/gain values can be different values according to variations of parts incorporated in respective units (analog converters).

Further, in the analog converter incorporated in a PLC, arbitrary offset/gain values can be additionally registered by a user in addition to offset/gain values registered in a nonvolatile memory when the analog converter is manufactured. With this configuration, the user can use not only a formulaic analog range prepared in a unit but also an arbitrary analog range corresponding to a device to be connected.

In connection to offset/gain values registered by a user, there has been proposed a technique in which a plurality of registration areas are provided and plural types of offset/gain values can be registered, so that one of these values can be selected and used (see, for example, Patent Literature 1). With this technique, it is possible to register a plurality of offset/gain values in advance in a nonvolatile memory, to select these values, and to use these values appropriately.

CITATION LIST

Patent Literature

Patent Literature 1: Japanese Patent Application Laid-open No. H7-78007

SUMMARY

Technical Problem

However, in the technique described in Patent Literature 1, if certain offset/gain values are readjusted, offset/gain values used before the readjustment are rewritten. As a result, when the offset/gain values used before the readjustment are used again, an adjustment therefor needs to be performed again. Accordingly, in a case where offset/gain values are erroneously rewritten to unintended values due to a regular adjustment of a system, which is a controlling target of a PLC, and then the system performs an unintended operation, there is a problem that, in order to recover the system, an adjustment needs to be performed again so that the erroneously rewritten offset/gain values are set to be appropriate offset/gain values.

The present invention has been achieved in view of the above problems, and an object of the present invention is to provide an analog converter and a PLC system in which, with respect to certain offset/gain values, after rewriting the set values by performing a readjustment, the set values used before the rewriting can be recovered.

Solution to Problem

The present invention is directed to an analog converter that achieves the object. The analog converter constitutes a programmable logic controller and performs analog-digital conversion by using offset/gain values. The analog converter includes an offset/gain value storage unit that is composed of a nonvolatile memory and stores therein the offset/gain values; an operation unit that performs analog-digital conversion by using the offset/gain values in the offset/gain value storage unit as values for an interpolation operation; and a previous offset/gain value storage unit that is composed of a nonvolatile memory and stores therein, as previous offset/gain values, the offset/gain values in the offset/gain value storage unit used in the past. The operation unit includes an offset/gain value setting unit that controls setting of the offset/gain values in the offset/gain value storage unit and storage of the previous offset/gain values in the previous offset/gain value storage unit.

Advantageous Effects of Invention

According to the present invention, offset/gain values in the past are stored in a previous offset/gain value storage unit, and offset/gain values used before are freely recalled from the previous offset/gain value storage unit by an offset/gain value storage unit to be reset as the latest offset/gain values. Accordingly, in an adjustment operation in a system that is a controlling target of a programmable logic controller system, even if unintended offset/gain values are erroneously registered and the system performs an unintended operation, the system can be easily recovered to a previous normal state without readjusting the offset/gain values.

DESCRIPTION OF EMBODIMENTS

Exemplary embodiments of an analog converter and a programmable logic controller system according to the present invention will be explained below in detail with reference to the accompanying drawings. The present invention is not limited to the embodiments.

Figure 1:
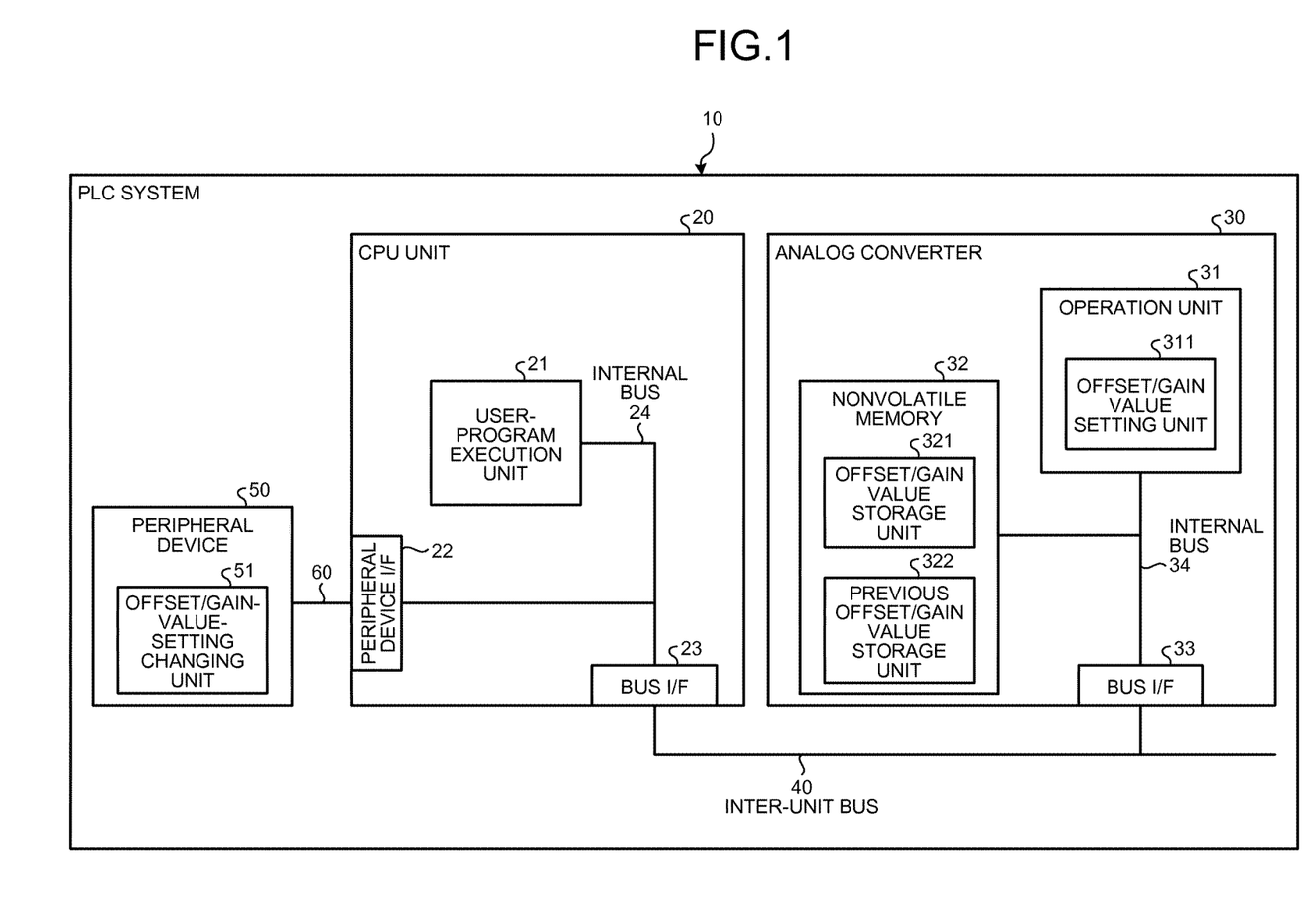
FIG. 1 is a block diagram schematically showing an overall configuration of a PLC system including an analog converter according to an embodiment.

FIG. 1 is a block diagram schematically showing an overall configuration of a PLC system including an analog converter according to an embodiment. In FIG. 1, processing units related to changing and setting offset/gain values in the present embodiment are shown, and illustrations of other processing units that control a controlling target such as an industrial device are omitted.

A PLC system 10 is constituted that a CPU (Central Processing Unit) unit 20 and an analog unit (analog converter) 30 are connected to each other via an inter-unit bus 40, and a peripheral device 50 such as a personal computer is connected to a unit (in this case, the CPU unit 20) that constitutes the PLC system 10 via a communication line 60. While FIG. 1 shows a case where the CPU unit 20 and the analog unit 30 are provided in the PLC system 10, depending on the purposes, it is also possible to provide other units such as a motion controller unit that executes multi-axis position control by controlling a servo motor or the like and a temperature controller unit that outputs a temperature control signal for heating and cooling the CPU unit 20 so that the temperature thereof reaches an instructed temperature. In the present embodiment, descriptions of units other than the CPU unit 20 and the analog unit 30 are omitted.

The CPU unit 20 repeats, at a predetermined interval, execution of a user program that is a program for controlling a controlling target such as an industrial device by operating various units included in the PLC system 10, acquisition of input values such as values used by the user program, and outputting of an execution result. The CPU unit 20 includes a user-program execution unit 21 that executes a user program, a peripheral device I/F 22 as an interface that connects the CPU unit 20 to the peripheral device 50, and a bus I/F 23 as a communication interface that performs communication of the CPU unit 20 with other units such as the analog unit 30 via the inter-unit bus 40. The user-program execution unit 21, the peripheral device I/F 22, and the bus I/F 23 are respectively connected to each other by an internal bus 24.

The analog unit 30 performs input and output of an analog signal such as a current value and a voltage value between an industrial device or the like, which is a controlling target of a PLC. The analog unit 30 includes an operation unit 31 that executes control of the entire analog unit 30, a nonvolatile memory 32 that stores therein offset/gain values used in an analog-digital conversion process, and a bus I/F 33 as a communication interface that performs communication of the analog unit 30 with the CPU unit 20 via the inter-unit bus 40. The operation unit 31, the nonvolatile memory 32, and the bus I/F 33 are respectively connected to each other by an internal bus 34.

The operation unit 31 has a function of converting an analog value acquired from a controlling target to a digital value and performing an analog-digital conversion process of converting a digital value acquired from the CPU unit 20 to an analog value. Furthermore, the operation unit 31 includes an offset/gain value setting unit 311 that writes offset/gain values in the nonvolatile memory 32 and reads the latest offset/gain values from an offset/gain value storage unit 321 of the nonvolatile memory 32 at the time of activating the unit.

The nonvolatile memory 32 is constituted by an EEPROM (Electrically Erasable Programmable Read-Only Memory) and the like, and includes the offset/gain value storage unit 321 as an area storing therein an offset value and a gain value, which are data used for performing linear interpolation on data to be input and output at the time of analog conversion, and a previous offset/gain value storage unit 322 as an area storing therein previously used offset/gain values in a time-series manner. In the present embodiment, while it is assumed that the nonvolatile memory 32 includes both the offset/gain value storage unit 321 and the previous offset/gain value storage unit 322, the previous offset/gain value storage unit 322 can be included in another nonvolatile memory. For example, it is also possible to configure that the analog unit 30 includes another nonvolatile memory separately from the nonvolatile memory 32, and the separately provided nonvolatile memory includes the previous offset/gain value storage unit 322. Furthermore, it is also possible to configure that an external memory located outside of the analog unit 30 includes the previous offset/gain value storage unit 322 and the analog unit 30 includes a communication I/F that communicates with the external memory.

The peripheral device 50 is constituted by elements such as a personal computer that can display setting and statuses of a user program. As a function related to the present embodiment, the peripheral device 50 includes an offset/gain-value-setting changing unit 51 that performs change-setting of offset/gain values stored in the nonvolatile memory 32 of the analog unit 30.

The nonvolatile memory 32 included in the analog unit 30 is explained in more detail. When a user adjusts offset/gain values so as to match input/output characteristics of an industrial device as a controlling target of a PLC, an offset value and a gain value, which are the adjustment result, are written in the offset/gain value storage unit 321 of the nonvolatile memory 32 by the offset/gain value setting unit 311. Information related to the date and time of writing the offset/gain values in the nonvolatile memory 32 can be stored in the offset/gain value storage unit 321 with these values so that it is possible to specify when the offset/gain values are adjusted. As explained in the Background section, conventionally, plural types of offset/gain values can be stored in the nonvolatile memory 32. Meanwhile, when a user makes an erroneous readjustment in the offset/gain values and has rewritten the contents of the nonvolatile memory 32, it is difficult to recover the rewritten contents to their original state. Therefore, the present embodiment provides, in the nonvolatile memory 32, the offset/gain value storage unit 321 that stores therein the latest offset/gain values as offset/gain values to be used for performing an analog-digital conversion process and the previous offset/gain value storage unit 322 that stores therein offset/gain values used for an analog-digital conversion process before the adjustment. That is, when readjustment of offset/gain values is performed, the contents of the offset/gain value storage unit 321 before rewriting those of the offset/gain value storage unit 321 are saved in the previous offset/gain value storage unit 322.

Figure 2:
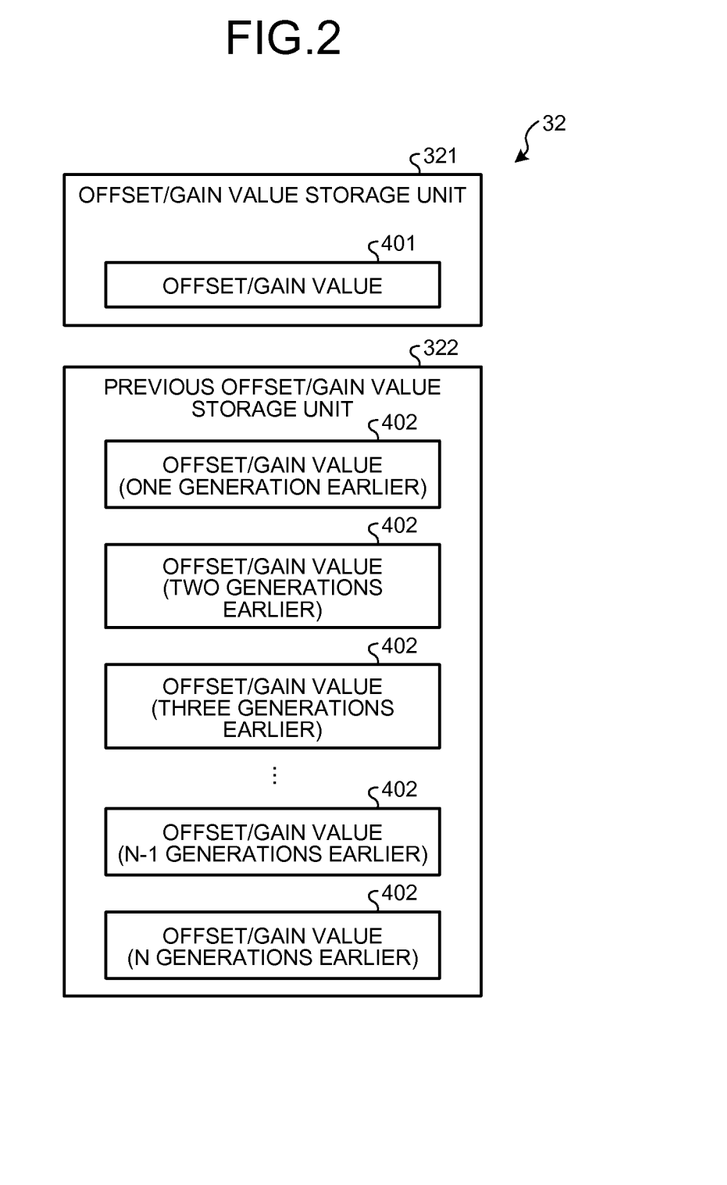
FIG. 2 is a diagram schematically showing a configuration of a nonvolatile memory according to the embodiment.

FIG. 2 is a diagram schematically showing a configuration of the nonvolatile memory according to the present embodiment. The offset/gain value storage unit 321 stores therein one set of the latest offset/gain values 401, and the previous offset/gain value storage unit 322 stores therein N sets of offset/gain values 402 in the past (N is a natural number). The number "N", which is the number of sets of the offset/gain values that can be stored in the previous offset/gain value storage unit 322, is arbitrary. Furthermore, while the offset/gain value storage unit 321 and the previous offset/gain value storage unit 322 respectively include an area that can store therein the offset/gain values for the number of channels included in the analog unit 30; however, in FIG. 2, a case where offset/gain values for only one channel is shown.

In the example shown in FIG. 2, in the previous offset/gain value storage unit 322, offset/gain value storage areas as generation management areas are provided for each generation. That is, an offset/gain value storage area of one generation earlier, an offset/gain value storage area of two generations earlier, an offset/gain value storage area of three generations earlier, . . . , an offset/gain value storage area of (N-1) generations earlier, and an offset/gain value storage area of N generations earlier are provided in the previous offset/gain value storage unit 322. As shown in FIG. 2, while a plurality of offset/gain values in the past can be stored in the previous offset/gain value storage unit 322, in the present embodiment, each of the offset/gain values is referred to as "generation" so as to distinguish them. That is, offset/gain values used for an analog-digital conversion process before the latest offset/gain values stored in the offset/gain value storage unit 321 are referred to as "one generation earlier", and offset/gain values used for an analog-digital conversion process even before are referred to as "two generations earlier". As explained later, when the offset/gain values 401 are newly set in the offset/gain value storage unit 321, the offset/gain values 402 having been stored in the offset/gain value storage areas of one generation earlier to (N-1) generations earlier in the previous offset/gain value storage unit 322 are respectively stored in the offset/gain value storage areas of two to N generations earlier, and the offset/gain values 401 having been stored in the offset/gain value storage unit 321 are stored in the offset/gain value storage area of one generation earlier in the previous offset/gain value storage unit 322.

Next, an offset/gain value setting process and an offset/gain value recovery process in the PLC system 10 with the above configuration are explained in this order.

<Offset/Gain Value Setting Process>

Figure 3:
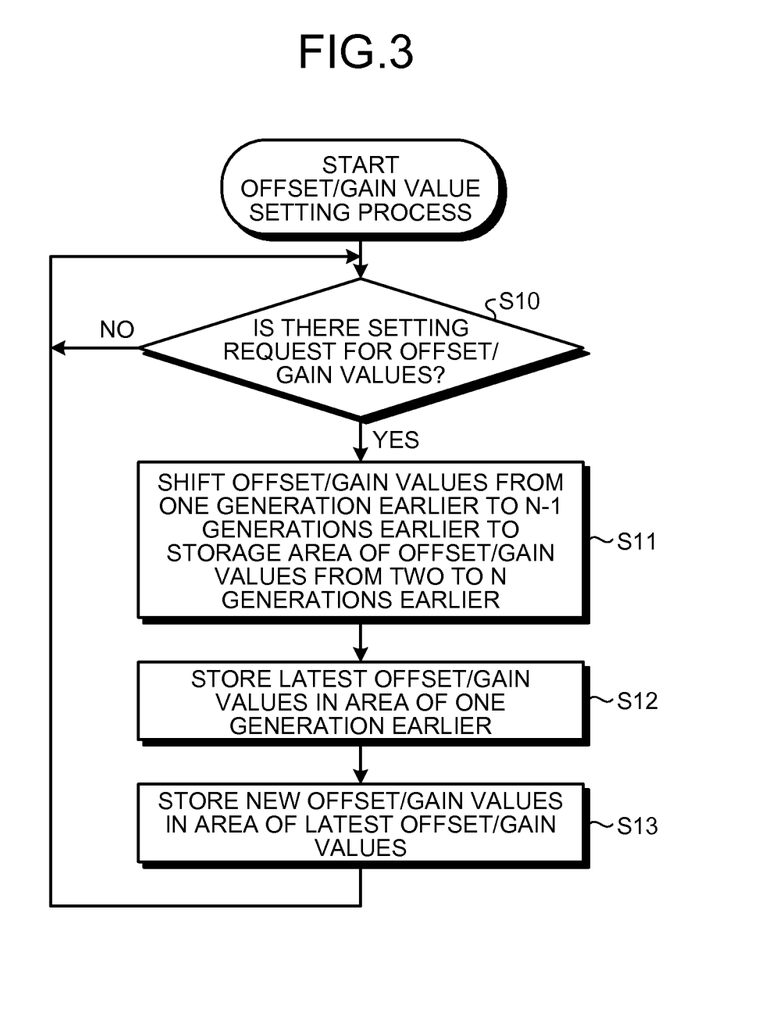
FIG. 3 is a flowchart showing an example of a setting process procedure of offset/gain values.
Figure 4:
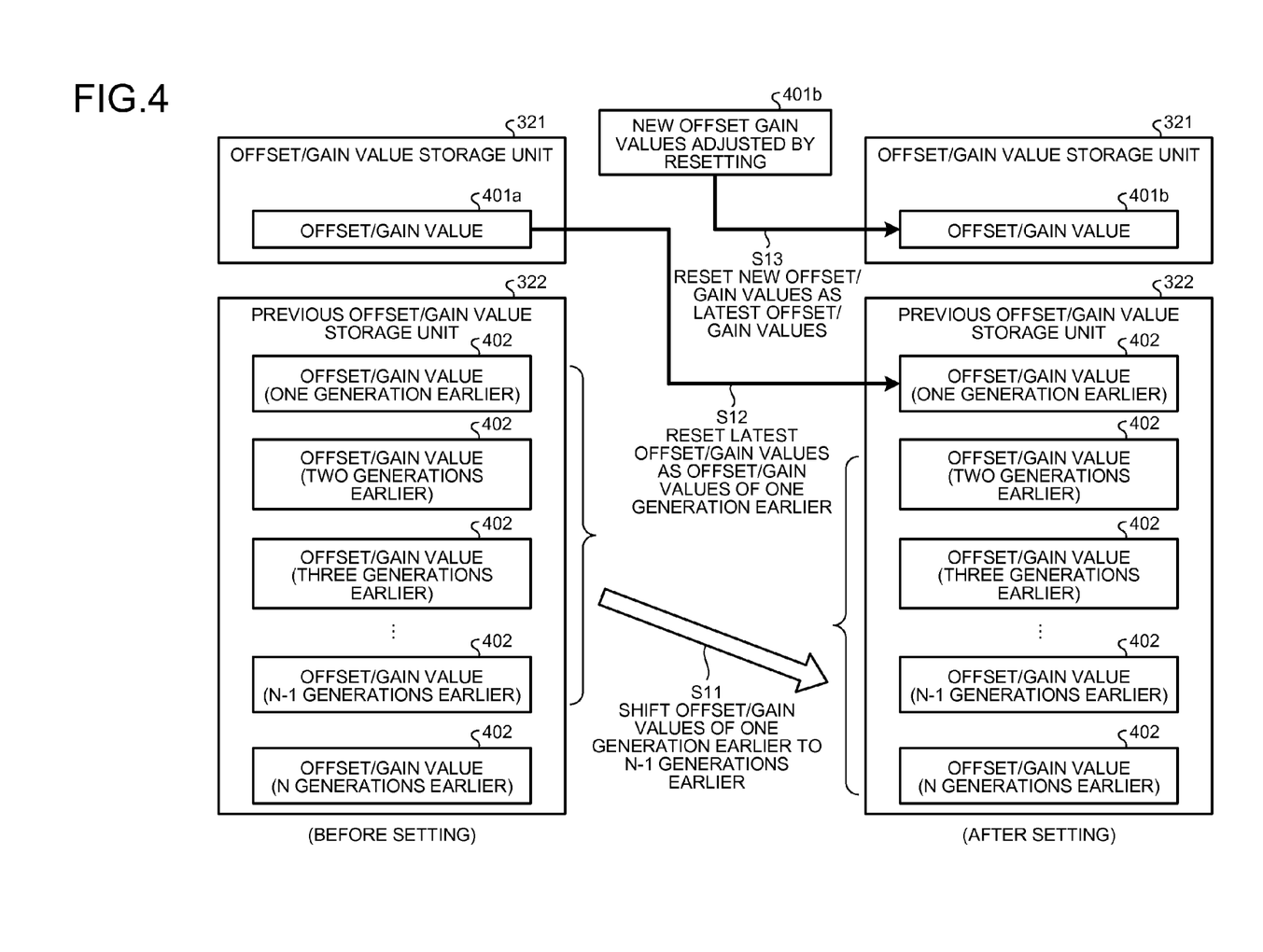
FIG. 4 is a diagram schematically showing a state of a setting process of offset/gain values in the nonvolatile memory.

FIG. 3 is a flowchart showing an example of a setting process procedure of offset/gain values, and FIG. 4 is a diagram schematically showing a state of an offset/gain value setting process in the nonvolatile memory 32.

First, the offset/gain value setting unit 311 of the operation unit 31 of the analog unit 30 determines whether there is a setting request for offset/gain values (Step S10). The setting request for offset/gain values is a request issued by a user from outside of the analog unit 30, and examples of the setting request include a request issued from a user program executed by the user-program execution unit 21 of the CPU unit 20 and a request issued by a user operation from the offset/gain-value-setting changing unit 51 operated on the peripheral device 50 connected to the CPU unit 20. When no setting request for offset/gain values has been received (NO at Step S10), the process is kept in a standby state until a setting request for offset/gain values is received.

Meanwhile, when a setting request for offset/gain values has been received (YES at Step S10), the offset/gain value setting unit 311 copies, in the previous offset/gain value storage unit 322 of the nonvolatile memory 32, offset/gain values 402 from one generation earlier to N-1 generations earlier in an area where offset/gain values from two to N generations earlier are stored (Step S11 in FIG. 3 and FIG. 4). With this process, the storage area of the offset/gain values 402 from one generation earlier to N-1 generations earlier is shifted by one generation to a direction of its older generation.

Furthermore, the offset/gain value setting unit 311 copies offset/gain values 401a, which have been used as data for interpolation at the time of analog conversion and as the latest offset/gain values up to this point, in a storage area of offset/gain values of one generation earlier in the previous offset/gain value storage unit 322 from the offset/gain value storage unit 321 (Step S12 in FIG. 3 and FIG. 4).

Thereafter, new offset/gain values 401b as a readjustment result are stored in the offset/gain value storage unit 321 as the latest offset/gain values (Step S13 in FIG. 3 and FIG. 4). The process then returns to Step S10. With the above procedures, the offset/gain value setting process ends.

<Offset/Gain Value Recovery Process>

Figure 5:
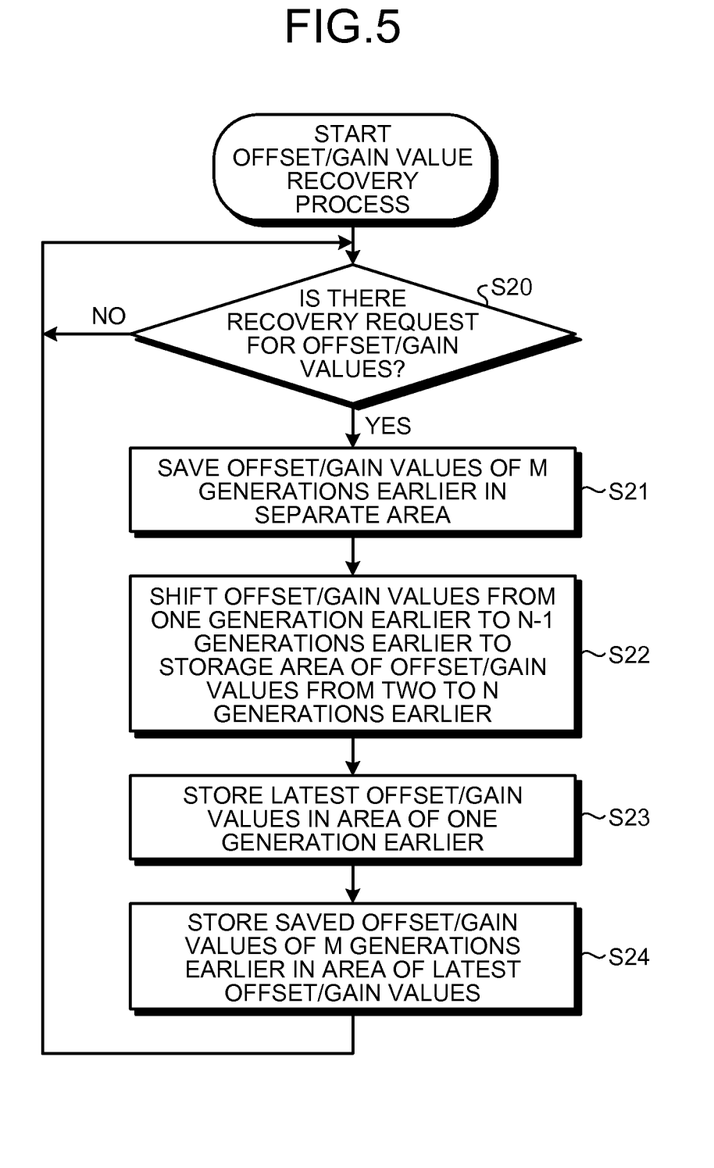
FIG. 5 is a flowchart showing an example of a recovery process procedure of offset/gain values.
Figure 6:
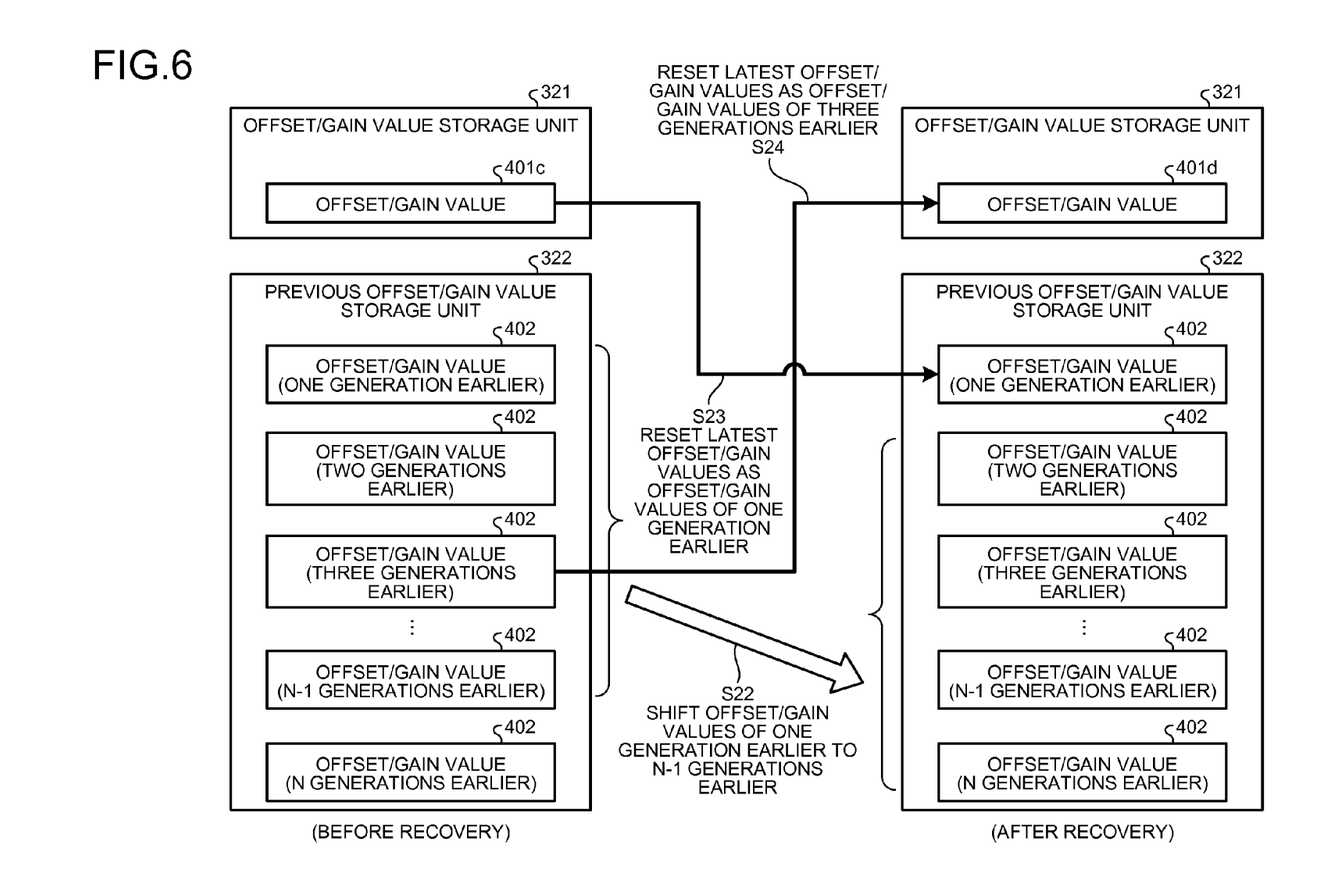
FIG. 6 is a diagram schematically showing a state of a recovery process of offset/gain values in the nonvolatile memory.

FIG. 5 is a flowchart showing an example of a recovery process procedure of offset/gain values, and FIG. 6 is a diagram schematically showing a state of an offset/gain value recovery process in the nonvolatile memory.

First, the offset/gain value setting unit 311 of the operation unit 31 of the analog unit 30 determines whether there is a recovery request for offset/gain values (Step S20). The recovery request for offset/gain values is a request issued by a user from outside of the analog unit 30, and examples of the recovery request include a request issued from a user program executed by the user-program execution unit 21 of the CPU unit 20 and a request issued by a user operation from the offset/gain-value-setting changing unit 51 operated on the peripheral device 50 connected to the CPU unit 20. The recovery request for offset/gain values includes a storage area (a recovery target) of the offset/gain value 402, which is specified by a user and then recovered among the previous offset/gain value storage unit 322. In this case, it is assumed that offset/gain values 402 of M generations earlier (M is a natural number equal to or smaller than N) are specified. When no recovery request for offset/gain values (NO at Step S10) has been received, the process is kept in a standby state until a recovery request for offset/gain values is received.

Meanwhile, when a recovery request for offset/gain values has been received (YES at Step S20), the offset/gain value setting unit 311 saves offset/gain values 402 of M generations earlier, as the recovery target specified by the recovery request for offset/gain values, in a separate area (Step S21). The separate area is an area in which data is temporarily saved, and the area can be either volatile or nonvolatile. That is, the separate area can be provided in an area other than the offset/gain value storage unit 321 and the previous offset/gain value storage unit 322 of the nonvolatile memory 32, or can be provided in a RAM (not shown).

Subsequently, the offset/gain value setting unit 311 copies, in the previous offset/gain value storage unit 322, offset/gain values 402 from one generation earlier to N-1 generations earlier in an area where offset/gain values 402 from two to N generations earlier are stored (Step S22 in FIG. 5 and FIG. 6). With this process, the storage area of the offset/gain values 402 from one generation earlier to N-1 generations earlier is shifted by one generation to a direction of its older generation.

Furthermore, the offset/gain value setting unit 311 copies offset/gain values 401c having been used as data for interpolation at the time of analog conversion and as the latest offset/gain values up to this point in a storage area of the offset/gain values 402 of one generation earlier in the previous offset/gain value storage unit 322 from the offset/gain value storage unit 321 (Step S23 in FIG. 5 and FIG. 6).

Thereafter, the offset/gain value setting unit 311 stores offset/gain values that are data specified as by a user as data to be recovered and saved in the separate area at Step S21, as the latest offset/gain values 401d, in the offset/gain value storage unit 321 (Step S24 in FIG. 5 and FIG. 6). The process then returns to Step S10. With the above procedures, the offset/gain value recovery process ends.

In the present embodiment, the offset/gain value storage unit 321 that stores therein currently used offset/gain values and the previous offset/gain value storage unit 322 that stores therein previous offset/gain values of up to a predetermined number of generations earlier are provided in the nonvolatile memory 32 of the analog unit 30, which constitutes the PLC system 10, and offset/gain values used in the past are read from the previous offset/gain value storage unit 322 and the read values are recovered in the offset/gain value storage unit 321. With this configuration, after readjusting offset/gain values and rewriting the values of the offset/gain value storage unit 321, even if these values are found to be inappropriate, it is possible to set the original offset/gain values in the offset/gain value storage unit 321 without performing any readjustment.

INDUSTRIAL APPLICABILITY

As described above, the analog converter and the PLC system according to the present invention are suitable for an analog unit mounted on a PLC.

REFERENCE SIGNS LIST

10 PLC system
20 CPU unit
21 user-program execution unit
22 peripheral device I/F
23, 33 bus I/F
24, 34 internal bus
30 analog unit (analog converter)
31 operation unit
32 nonvolatile memory
40 inter-unit bus
50 peripheral device
51 offset/gain-value-setting changing unit
60 communication line
311 offset/gain value setting unit
321 offset/gain value storage unit
322 previous offset/gain value storage unit

The invention claimed is:

1. An analog converter constituting a programmable logic controller and performing analog-digital conversion by using current offset and gain values, the analog converter comprising:
an offset and gain value storage unit that:
is composed of a first nonvolatile memory; and
stores, in the first nonvolatile memory, the current offset and gain values;
an operation unit that performs analog-digital conversion by using the current offset and gain values stored in the offset and gain value storage unit as values for an interpolation operation; and
a previous offset and gain value storage unit that:
is composed of a second nonvolatile memory comprising a first generation management area and a second generation management area;
stores, in the first generation management area, first previous offset and gain values that are generated one generation earlier than the current offset and gain values; and
stores, in the second generation management area, second previous offset and gain values that are generated two generations earlier than the current offset and gain values;
wherein the operation unit includes an offset and gain value setting unit that:
controls setting of the current offset and gain values in the offset and gain value storage unit; and
controls storage of the first previous offset and gain values and the second previous offset and gain values in the previous offset and gain value storage unit,
wherein the offset and gain value setting unit further:
determines whether a setting request for new offset and gain values in the offset and gain value storage unit is received; and
maintains a standby state in response to the determining that the setting request for the new offset and gain values in the offset and gain value storage unit is not received, and
wherein, upon reception of the setting request for the new offset and gain values in the offset and gain value storage unit, the offset and gain value setting unit further:
copies the first previous offset and gain values stored in the first generation management area, into the second generation management area;
copies the current offset and gain value stored in the offset and gain value storage unit, into the first generation management area; and
stores the new offset and gain values into the offset and gain value storage unit.

2. The analog converter according to claim 1, wherein the copying of the current offset and gain values stored in the offset and gain value storage unit, into the first generation management area, is performed after the copying of the first previous offset and gain values stored in the first generation management area, into the second generation management area, and
wherein the storing of the new offset and gain values into the offset and gain value storage unit is performed after the copying of the current offset and gain values stored in the offset and gain value storage unit, into the first generation management area.

3. The analog converter according to claim 1, wherein, upon reception of a recovery request for one among the first previous offset and gain values and the second previous offset and gain values, the offset and gain value setting unit further:
acquires the one among the first previous offset and gain values and the second previous offset and gain values, from the previous offset and gain value storage unit;
stores the current offset and gain values stored in the offset and gain value storage unit, in the previous offset and gain value storage unit; and stores the acquired one among the first previous offset and gain values and the second previous offset and gain values, in the offset and gain value storage unit as new offset and gain values, after the storage of the current offset and gain values stored in the offset and gain value storage unit, in the previous offset and gain value storage unit.

4. A programmable logic controller system comprising:
a programmable logic controller including:
an analog converter including:
   an offset and gain value storage unit that:
      is composed of a first nonvolatile memory; and
      stores, in the first nonvolatile memory, the current offset and gain values;
   an operation unit that performs analog-digital conversion by using the current offset and gain values stored in the offset and gain value storage unit as values for an interpolation operation; and
   a previous offset and gain value storage unit that:
      is composed of a second nonvolatile memory comprising a first generation management area and a second generation management area;
      stores, in the first generation management area, first previous offset and gain values that are generated one generation earlier than the current offset and gain values; and
      stores, in the second generation management area, second previous offset and gain values that are generated two generations earlier than the current offset and gain values;
a CPU unit that controls operations of another unit including the analog converter; and
a peripheral device that performs setting of a user program of the CPU unit,
wherein the programmable logic controller and the peripheral device are connected via a communication line,
wherein the peripheral device includes an offset and gain-value-setting changing unit that issues a request for changing the offset and gain values stored in the offset and gain value storage unit of the analog converter, to the analog converter via the CPU unit,
wherein the operation unit includes an offset and gain value setting unit that:
   controls setting of the current offset and gain values in the offset and gain value storage unit; and
   controls storage of the first previous offset and gain values and the second previous offset and gain values in the previous offset and gain value storage unit,
wherein the offset and gain value setting unit further:
   determines whether a setting request for new offset and gain values in the offset and gain value storage unit is received; and
   maintains a standby state in response to the determining that the setting request for the new offset and gain values in the offset and gain value storage unit is not received, and
wherein, upon reception of the setting request for the new offset and gain values in the offset and gain value storage unit, the offset and gain value setting unit further:
   copies the first previous offset and gain values stored in the first generation management area, into the second generation management area;
   copies the current offset and gain value stored in the offset and gain value storage unit, into the first generation management area; and
   stores the new offset and gain values into the offset and gain value storage unit.

5. The analog converter according to claim 1, wherein, upon reception of a recovery request for the second previous offset and gain values, the offset and gain value setting unit further:
   stores the second previous offset and gain values in a memory area;
   copies the first previous offset and gain values stored in the first generation management area, into the second generation management area, after the storing of the second previous offset and gain values in the memory area;
   copies the current offset and gain value stored in the offset and gain value storage unit, into the first generation management area, after the copying of the first previous offset and gain values stored in the first generation management area, into the second generation management area; and
   stores the second previous offset and gain values stored in the memory area, into the offset and gain value storage unit, after the copying of the current offset and gain value stored in the offset and gain value storage unit, into the first generation management area.

* * * * *